United States Patent
Chowdhury et al.

(10) Patent No.: US 10,359,158 B2
(45) Date of Patent: *Jul. 23, 2019

(54) LIGHTING SELECTION SYSTEM AND METHOD

(71) Applicant: GE LIGHTING SOLUTIONS, LLC, East Cleveland, OH (US)

(72) Inventors: Ashfaqul I. Chowdhury, Broadview Heights, OH (US); Kevin Jeffrey Benner, Salon, OH (US)

(73) Assignee: CURRENT LIGHTING SOLUTIONS, LLC, East Cleveland, OH (US)

( * ) Notice: Subject to any disclaimer, the term of this patent is extended or adjusted under 35 U.S.C. 154(b) by 109 days.

This patent is subject to a terminal disclaimer.

(21) Appl. No.: 15/266,068

(22) Filed: Sep. 15, 2016

(65) Prior Publication Data

US 2017/0089527 A1 Mar. 30, 2017

Related U.S. Application Data

(60) Provisional application No. 62/235,485, filed on Sep. 30, 2015.

(51) Int. Cl.
*H05B 33/08* (2006.01)
*F21K 99/00* (2016.01)

(52) U.S. Cl.
CPC .......... *F21K 99/00* (2013.01); *H05B 33/0857* (2013.01)

(58) Field of Classification Search
CPC .... H05B 33/02; H05B 33/08; H05B 33/0803; H05B 33/0806; H05B 33/0842; H05B 33/0845; H05B 33/0857; H05B 33/086; F21K 19/00
See application file for complete search history.

(56) References Cited

U.S. PATENT DOCUMENTS

| | | | | |
|---|---|---|---|---|
| 9,936,558 | B1* | 4/2018 | Benner | H05B 33/0857 |
| 2008/0215279 | A1* | 9/2008 | Salsbury | H05B 33/0863 |
| | | | | 702/107 |
| 2009/0129074 | A1* | 5/2009 | Roberts | G01J 3/00 |
| | | | | 362/231 |
| 2009/0168406 | A1* | 7/2009 | Kawasaki | G02F 1/133603 |
| | | | | 362/97.3 |
| 2009/0246895 | A1* | 10/2009 | You | G09G 5/026 |
| | | | | 438/20 |
| 2011/0037080 | A1* | 2/2011 | Emerson | H01L 25/0753 |
| | | | | 257/88 |

(Continued)

OTHER PUBLICATIONS

International Search Report and Written Opinion issued in connection with corresponding Application No. PCT/US2016/053028 dated Dec. 1, 2016.

*Primary Examiner* — Jason Crawford
(74) *Attorney, Agent, or Firm* — Buckley, Maschoff & Talwalkar LLC

(57) ABSTRACT

A lighting selection system and method obtain individualized characteristic data for each of plural light emitting devices, determine a difference between a value of the characteristic data and a designated target value for each of the light emitting devices, and group the light emitting devices into different groups based on the differences between the values of the characteristic data and the designated target value. The differences of the light emitting devices in a common group of the groups are closer together than the differences of the light emitting devices in other groups of the groups. The system and method also may select at least one of the groups of the light emitting devices for inclusion in a light device.

21 Claims, 11 Drawing Sheets

(56) References Cited

U.S. PATENT DOCUMENTS

| | | |
|---|---|---|
| 2012/0275147 A1 | 11/2012 | Roberts et al. |
| 2013/0020929 A1* | 1/2013 | van de Ven ......... H01L 25/0753 313/498 |
| 2013/0107515 A1* | 5/2013 | You ........................ G09G 5/026 362/231 |

* cited by examiner

LIGHTING SELECTION SYSTEM AND METHOD

FIELD

Embodiments of the subject matter disclosed herein relate to systems and methods for selecting light emitting devices from among several light emitting devices for inclusion in a lighting system.

BACKGROUND

Light devices, such as lamps, may include several light emitting diodes that generate light at the same time. Due to manufacturing variability, no two light emitting diodes in the same light device may output the exact same light. The chromaticity, luminous flux, or other characteristics of the light may vary between and among the light emitting diodes in the same light device.

Currently, manufactures measure characteristics of the light that is output by the different light emitting diodes. The light emitting diodes are then associated with each other in sets, with each set associated with a range of characteristics of the light generated by the light emitting diodes in that set. But, there currently is no way to determine the characteristic of the light generated by each individual light emitting diode in each set once the diodes are included into a set. As a result, a manufacturer of a light device may select several light emitting diodes from one or more different sets in an attempt to cause the light device to generate light having a target color. Because of the range of characteristics of the light that may be generated by the different light emitting diodes, however, it is unknown how close the actual light will be to the target color.

The light emitting diodes that do not mix with other light emitting diodes in the same light device to produce the light with the target color may therefore be discarded and replaced with other light emitting diodes. Finding the right combination of the light emitting diodes to include in the same light device can be a trial-and-error process, and lead to significant waste of light emitting diodes.

BRIEF DESCRIPTION

In one embodiment, a method (e.g., a method for selecting light emitting devices for inclusion in a light device) includes obtaining individualized characteristic data for each of plural light emitting devices, determining a difference between a value of the characteristic data and a designated target value for each of the light emitting devices, and grouping the light emitting devices into different groups based on the differences between the values of the characteristic data and the designated target value. The differences of the light emitting devices in a common group of the groups are closer together than the differences of the light emitting devices in other groups of the groups. The method also includes selecting at least one of the groups of the light emitting devices for inclusion in a light device.

In another embodiment, a system (e.g., a light selection system) includes one or more processors configured to obtain individualized characteristic data for each of plural light emitting devices and to determine a difference between a value of the characteristic data and a designated target value for each of the light emitting devices. The one or more processors also are configured to determine different groups of the light emitting devices based on the differences between the values of the characteristic data and the designated target value. The differences of the light emitting devices in a common group of the groups are closer together than the differences of the light emitting devices in other groups of the groups.

In another embodiment, a method (e.g., a method for selecting light emitting devices) includes determining chromaticity coordinates of light generated by each of plural light emitting diodes, determining differences between the chromaticitycoordinates and a designated chromaticitycoordinate of a designated target color for each of the light emitting diodes, grouping the light emitting diodes into pairs based on the differences (where each pair includes the light emitting diodes having vectors extending from the chromaticitycoordinates to the designated chromaticitycoordinate that are closer in magnitude to each other than other light emitting diodes but opposite in direction), and selecting at least one of the pairs of the light emitting devices for inclusion in a light device.

BRIEF DESCRIPTION OF THE DRAWINGS

The subject matter described herein will be better understood from reading the following description of non-limiting embodiments, with reference to the attached drawings, wherein below.

DETAILED DESCRIPTION

Figure 1:
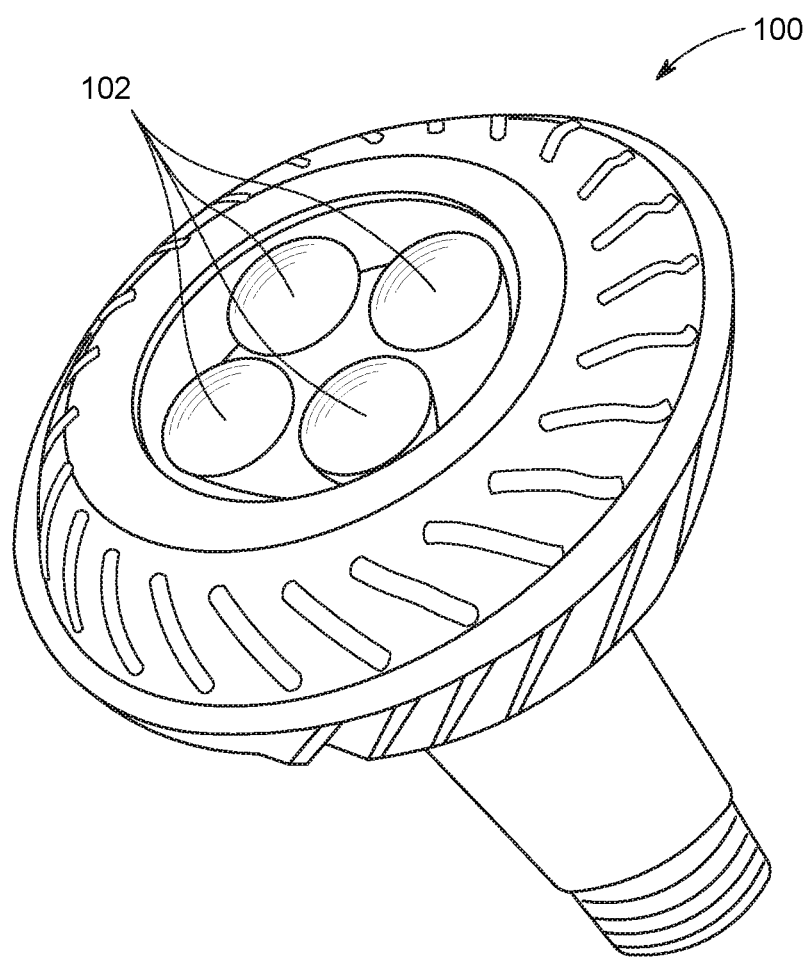
FIG. 1 illustrates one example of a light device.

Embodiments of inventive subject matter described herein provide for systems and methods that examine individual characteristics of different light emitting devices and group different light emitting devices together based on the characteristics. Differences between the characteristics of the light emitting devices and one or more target values are determined, and the light emitting devices are grouped together based on these differences. As described herein, in one embodiment, a first light emitting device may be paired with a second light emitting device such that the combined differences of the characteristics of each light emitting device to the target value results in the light generated by the combination of the first and second light emitting devices having a characteristic that is closer to the target value than a combination of the first or second light emitting device with another light emitting device. After grouping the light emitting devices a first time, a characteristic of the grouped light emitting devices may be determined and compared to a target value. Based on differences between the characteristics of the grouped light emitting devices and the target value, different groups of the light emitting devices may be combined to form larger groups in a similar manner. The larger groups of the light emitting devices can have characteristics that are closer to the target value of the characteristic than other, different groupings of the light emitting devices.

From a large population of manufactured light emitting devices (also referred to herein as LEDs), the light emitting devices are selected to be used in the construction of light devices, such as luminaires, fixtures, lamps, etc. The characteristic data for the light emitting devices (e.g., forward voltage, luminous flux, color, etc.) are known based on measurements made during production or based on other sources of the data. A selection process described herein is used to select light emitting devices for each light device such that the color point of each of the light devices is very similar (e.g., there is lower fixture-to-fixture variation than is possible with other selection methods).

In one embodiment, light emitting devices are grouped into pairs such that the combined color point of the pair of light emitting devices is very close to a target color point of the light device in which the light emitting devices will be included. In one example that does not limit all embodiments of the subject matter described herein, this can done by creating virtual bins in color space or other space (representative of characteristics of the light emitting devices and the target characteristic value). The bins can divide the color space of the full population into a number of radial sections. Light emitting devices in opposing bins (e.g., separated by 180 degrees) are paired, starting with the light emitting devices generating light with chromaticity that is the furthest or farther than one or more other light emitting devices in the same bin from the target characteristic value (e.g., the target color point). This process is repeated for several light emitting devices. The number of virtual bins can then be decreased, and this pairing process can be repeated with the remaining light emitting devices left unpaired from the previous pairing process. The re-binning and pairing process can be iteratively repeated until all light emitting devices are paired (or an odd number of unpaired light emitting devices remain). The process can be repeated using pairs of the light emitting devices, such as by pairing pairs of the light emitting devices based on virtual bins and the distances (e.g., in color space) of the light generated by the pairs of light emitting devices. The pairing of pairs of the light emitting devices can be repeated by iteratively reducing the number of bins, pairing pairs of light emitting devices, and so on, until all pairs of the paired light emitting devices are combined and/or an odd number of pairs of the light emitting devices remain.

FIG. 1 illustrates one example of a light device 100. The light device 100 is used as one example of the types of devices that light emitting devices 102 may be included in. As described herein, a lighting selection system and method can be used to select two or more light emitting devices 102 for inclusion in the same light device 100. The light emitting devices 102 that are selected are chosen so that one or more characteristics of the light emitting devices 102 and/or the light generated by a combination of the light emitting devices 102 is closer to a designated target value than a different combination of the light emitting devices 102 in the same light device 100. For example, the chromaticity of the light emitted by individual ones of the light emitting devices 102 may be different from a target cremaster the value. Using one or more embodiments of the lighting selection system and method described herein however, a combination of the light emitting devices 102 may be determined to cause the light that is generated by a combination of the light amine devices 102 to have a cremaster that is closer to the designated target cremaster values that anyone of the individual light emitting devices 102 alone or a different combination of light emitting devices 102. While the light device 100 is shown as a lamp or bowl, alternatively, one or more other types of light devices that include 2 or more light emitting devices 102 may be used in connection with the systems and methods described herein. Additionally, while the description herein focuses on the light emitting devices 102 being light emitting diodes, other types of light emitting devices may be used instead.

Figure 2:
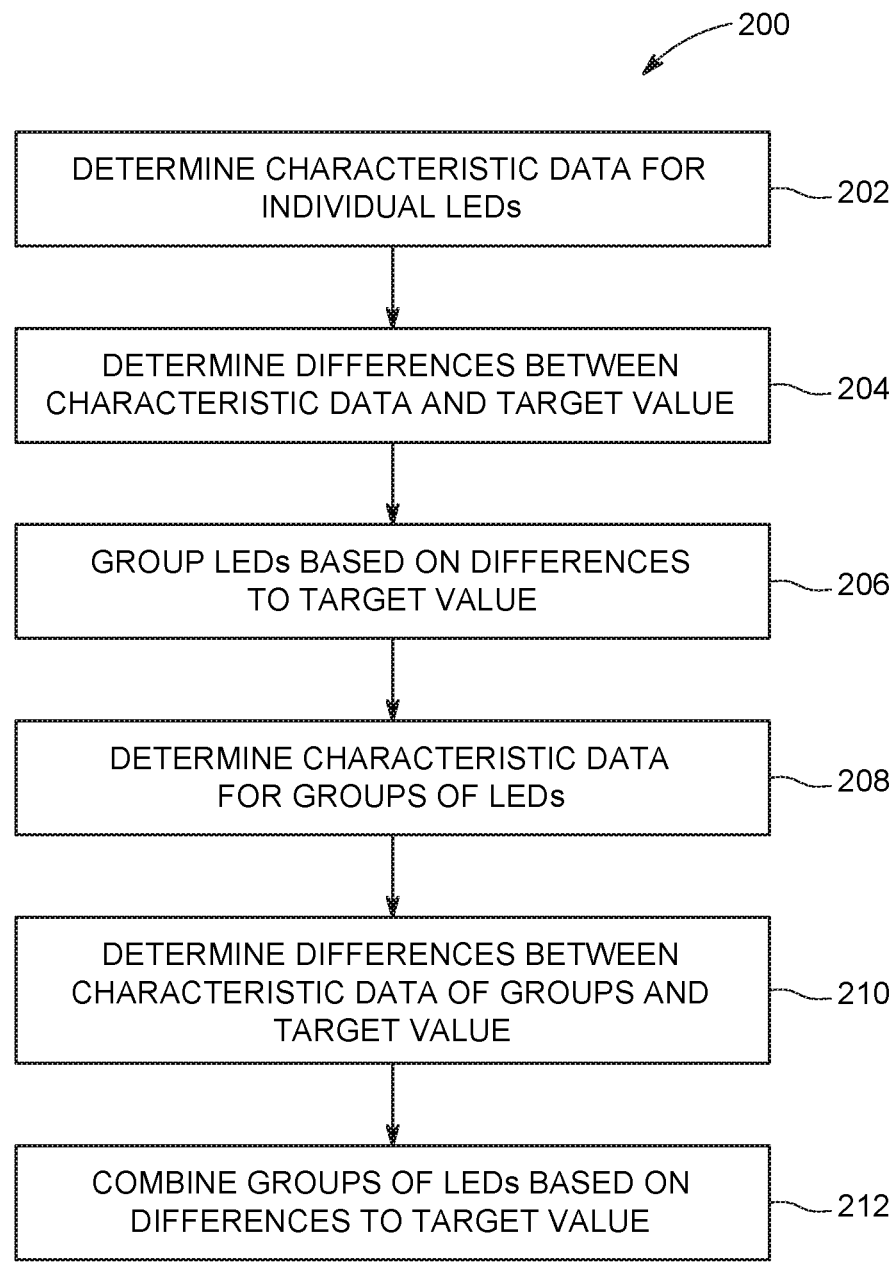
FIG. 2 illustrates a flowchart of one embodiment of a method for selecting light emitting devices for inclusion in the light device.

FIG. 2 illustrates a flowchart of one embodiment of a method 200 for selecting light emitting devices for inclusion in the light device. The method 200 may be used select a subset of light emitting devices from a larger set of light emitting devices 102 for inclusion in the same light device 100. The method 200 operates by determining individual characteristic data of the light generated by each of the light emitting devices 102, determining differences between the characteristic data associated with each light emitting device 102 and a designated target value of the characteristic data, and then grouping two or more of the light emitting devices 102 together based on these differences. By combining the different light emitting devices 102 based on the differences to the target value, the combined output of the light emitting devices 102 in the same group results in light output by the group of light emitting devices 102 being closer to the designated target value than other combinations of the light emitting devices 102.

At 202, characteristic data for individual light emitting devices 102 is determined. The characteristic data that is determined can include or represent characteristics of the light generated by the light emitting devices 102. For example, the characteristic data can represent chromaticity of the light, a luminous flux of the light, an intensity of the light, a distribution or spread of the light, a color correlated temperature of the light, etc. Optionally, the characteristic data may represent characteristics of the light emitting devices 102. For example, the characteristic data can represent a forward voltage of the light emitting devices 102, a temperature of the light emitting devices in operation, etc. The characteristic data that is determined can be referred to as individualized characteristic data in that each of the light emitting devices 102 is associated with its own characteristic data. In contrast to some known selection processes, where a group of light emitting devices are associated with a range of characteristic data with the characteristic date of each individual light emitting device not being known, the individualized characteristic data is known prior to the selection process in one embodiment of the method 200.

At 204, differences between the characteristic data of the light emitting devices 102 and a designated target value are determined. In one aspect, the differences can represent differences between the chromaticity of the light generated by the different light emitting devices 102 and a designated chromaticity. Optionally, the differences can represent numerical differences between other characteristic data of the light emitting devices 102 and a designated target value. For example, the differences can represent voltage differences between forward voltages of the light emitting devices 102 and a designated forward voltage, differences between luminous fluxes of the light generated by the different light emitting devices 102 and a designated luminous flux, etc.

At 206, the light emitting devices 102 are grouped based on differences between the characteristic data of the individual light emitting devices 102 and the target value. The light emitting devices 102 may be grouped by associating the light emitting devices 102 in the same group with each other, such as in a list, table, or other memory structure, or by placing the light emitting assemblies 102 in the same group physically close to each other in a manufacturing environment. As described herein, the light emitting devices 102 are grouped together such that a combination of light emitting devices 102 in the group has characteristic data that is closer to a designated target value than any one of the individual light emitting devices 102 alone and/or a different combination of the light emitting devices 102. For example, a first difference between the chromaticity of a light generated by a first light emitting device 102 and a designated target chromaticity and a second difference between the chromaticity of the light generated by a different, second light emitting device 102 and the same designated target chromaticity can be used to determine that the first and second light device 102 should be combined in a group (as described below). The combined light output of the first and second light emitting devices 102 may have a characteristic (for example, chromaticity) that is closer to the designated target chromaticity than the light generated by the first light emitting device 102 alone, the light generated by the second light emitting device 102 alone, a combination of the first light emitting device 102 with a light emitting device 102 other than the second light emitting device 102, and/or a combination of the second light emitting device 102 with a light emitting device 102 other than the first light emitting device 102.

The grouping of the light emitting devices 102 may be repeated one or more additional times. For example, subsequent to a first iteration of combining the light emitting devices 102 based on their individualized characteristic data, some of the light emitting devices 102 may not be associated with groups of other light emitting devices 102. As described below, one or more additional grouping processes may be performed to group additional ones, or all remaining ones, of the light emitting devices 102 that previously were not paired or grouped with other light emitting devices 102.

At 208, characteristic data for different groups of the light emitting devices 102 are determined. For example, characteristic data may be referred to as group or paired characteristic data, and can be determined for each of the groups of the light emitting devices 102 identified at 206. This group characteristic data can represent one or more characteristics of the light generated by a combination of the light emitting devices 102 in each of the groups. Optionally, this group characteristic data can represent one or more other characteristics of the groups of the light emitting devices 102. The group characteristic data can include, for example, chromaticity of the color of the combined light output of light emitting devices 102 in each group, the luminous flux of the light generated by combination of light emitting devices 102 in each group, a combined forward voltage of the light emitting devices 102 in each of the groups, etc.

At 210, differences between the group characteristic data of each of the groups of the light emitting devices 102 and a designated target value of the characteristic data are determined. The designated target value may be the same value or a different value for the target value used in connection with 204 and/or 206. At 212, different groups of the light emitting devices are combined into larger groups based on differences between the group characteristic data and the designated target value. For example, if the light emitting devices 102 are grouped into pairs at 206, then two pairs of the light emitting devices 102 may be combined into a larger group at 212.

Two or more groups of the light emitting devices 102 may be combined into a larger group of light emitting devices 102 such that the characteristic data of the larger group of the light emitting devices 102 is closer to the designated target value than the group characteristic data of a different grouping of two or more groups the light emitting devices 102. For example, a combination of a first pair of light emitting devices 102 and a second pair of light emitting devices 102 into a group can result in the group of the first and second pairs of the light emitting devices 102 having a group characteristic data that is closer to the designated target value than the group characteristic data of the first pair of the light emitting devices 102 alone, the group characteristic of the second pair of the light emitting devices 102 alone, a group characteristic of a combination of the first pair of the light emitting device 102 with a pair of the light emitting devices 102 other than the second pair, and/or a combination of the second pair of the light emitting devices 102 with a pair of the light emitting devices 102 other than the first pair.

The grouping of light emitting devices 102 and/or the grouping of paired or groups of light emitting devices 102 optionally may be repeated one or more additional times. One or more of the groups of the light emitting devices may then be selected for inclusion in the same light device 100. For example, a group of the light emitting devices that is determined at 212 may be included in the same light device 100. Another group of the light emitting devices 102 determined at 212 may be included in another, different light device 100, and so on. The characteristic data of the light and/or lighting emitting devices 102 in a light device 100 may be closer to a designated target value than another combination of light emitting devices 102 in the same light device 100.

Figure 3:
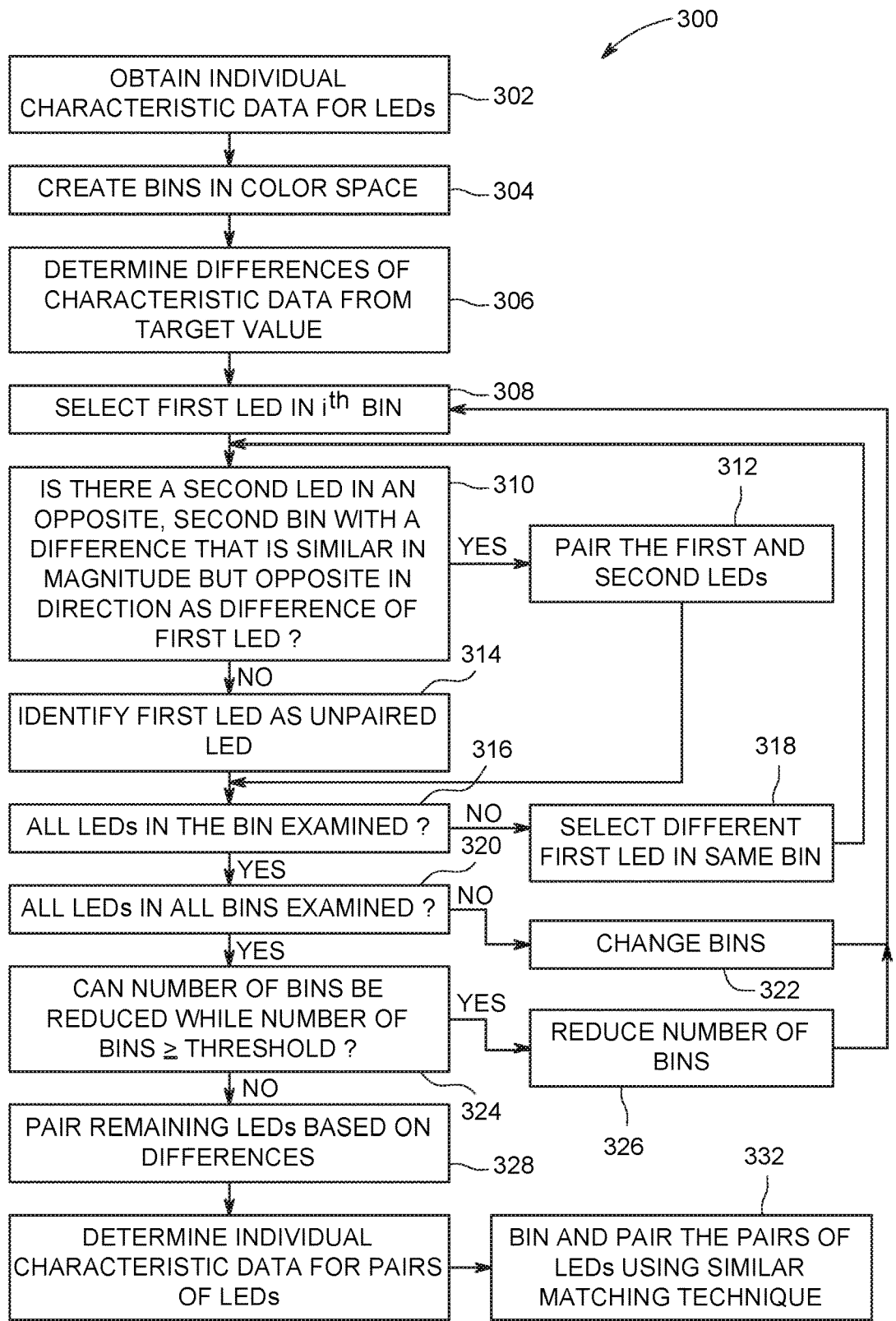
FIG. 3 illustrates a flowchart of a method for selecting light emitting devices to be included in a light device according to one embodiment.

FIG. 3 illustrates a flowchart of a method 300 for selecting light emitting devices to be included in a light device according to one embodiment. The method 300 may represent one version or embodiment of the method 200 shown and described above in connection with FIG. 2. While the method 300 focuses on chromaticity as the characteristic data of the light emitting devices 102, optionally, another type of characteristic data or one or more additional types of characteristic data may be examined.

At 302, individual characteristic data for light emitting devices are obtained. The characteristic data can represent chromaticity of the light generated by individual ones of the light emitting devices. Due to variations in manufacturing of the light emitting devices, different light emitting devices may generate light having slightly different chromaticity.

Figure 4:
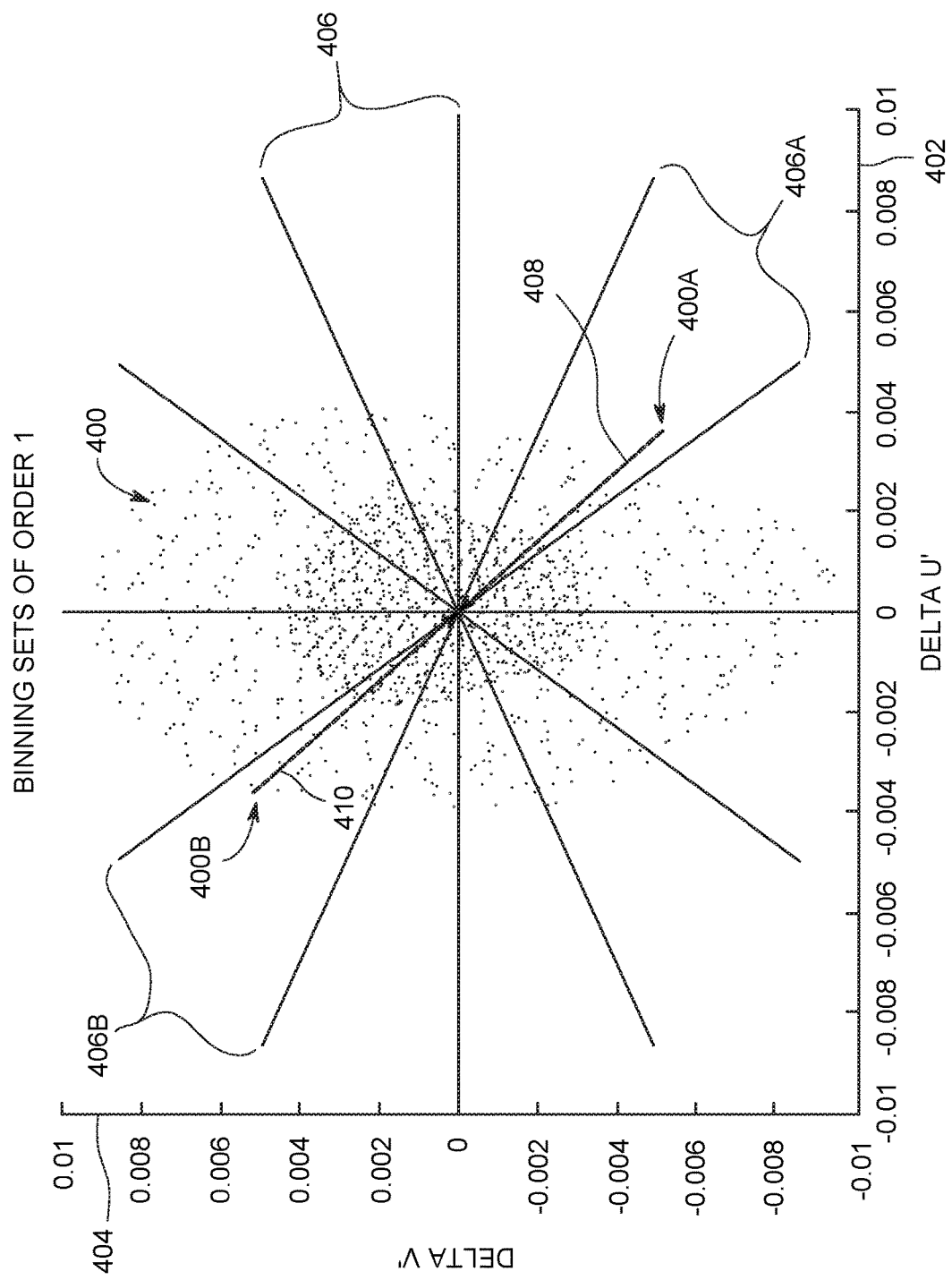
FIG. 4 illustrates characteristic data of several light emitting devices shown in FIG. 1 according to one example.

FIG. 4 illustrates characteristic data 400 of several light emitting devices 102 shown in FIG. 1 according to one example. The characteristic data 400 is represented as a dot or point in color space, with each dot or point of the characteristic data 400 representing the color of the light emitted by a different light emitting device 102. The characteristic data 400 is shown alongside a horizontal axis 402 and a vertical axis 404. The horizontal axis 402 represents differences in the u' chromaticity value of the light generated by the light emitting devices 102 and the u' value of a designated target chromaticity value or coordinates. The vertical axis 404 represents differences in the v' chromaticity value of the light generated by the light emitting devices 102 and the v' value of the designated target chromaticity value or coordinates. The designated target chromaticity value is located at a value of zero along the horizontal axis 402 and at a value of zero of the vertical axis 404. Due to variations in manufacturing and other causes, the color of the light that is emitted by the different light emitting devices 102 slightly differs from the target chromaticity value, as shown by the distribution of characteristic data 400 around and not on the target chromaticity value in FIG. 4.

Returning to the description of the method 300 shown in FIG. 3, at 304, virtual bins are created in the color space that includes the characteristic data of the light emitting devices 102. The virtual bins can represent segmentations of different chromaticity values of light. The virtual bins 406 radially divide the color space shown in FIG. 4 around the target chromaticity value. In another embodiment, the virtual bins may have another shape. For example, the virtual bins can represent circles, squares, or the like, that delineate different portions of the color space. The number of virtual bins in which the color space divided can be an even number to allow for the pairing of characteristic data of light emitting devices having differences that are equal or similar magnitude but opposite in direction, as described below.

The virtual bins may not represent tangible containers, but may represent divisions of the color space in which the light generated by the light emitting devices 102 may be located. In FIG. 4, twelve virtual bins 406 are created. The bins 406 represent radial divisions or segments of the color space, with each bin 406 encompassing an equivalent, but different, portion of the color space. Optionally, another number of virtual bins 406 may be created, such as ten bins, eight bins, six bins, four bins, two bins, or the like. In one embodiment, an even number of the virtual bins 406 is created at 304.

At 306, differences between the characteristic data of the different light emitting devices from the target value are determined. As shown in FIG. 4, the differences between the characteristic data of the light emitting devices 102 and the designated target value may be represented as difference vectors 408, 410. The size or length of the difference vectors 408, 410 represent the magnitude of difference between the characteristic data 400 of the light emitting device 102 and the target value. The orientation of the difference vectors 408, 410 can represent the direction between the characteristic data of the light generated by the light emitting device 102 and the target value. While the difference vectors 408, 410 are shown as extending from the characteristic data 400 to the target value, optionally, the difference vectors 408, 410 may extend from the target value to the characteristic data.

The light emitting devices 102 may be examined in turn in order to pair or otherwise group the light emitting devices together. In one embodiment, the method 300 may proceed iteratively by examining the light emitting devices 102 in one bin and pairing these light emitting devices with other light emitting devices in another bin, before pairing or otherwise grouping the light emitting devices in another bin with additional light emitting devices in another bin. Alternatively, the method 300 may proceed in another manner.

At 308, a first light emitting device 102 is selected for examination. For example, in an $i^{th}$ bin (where i represents the number of the bin with the light emitting devices 102 currently being examined for pairing with other light emitting devices), a light emitting device 102 is selected for pairing with another light emitting device 102. The light emitting device 102 that is selected may have a difference vector or difference 408 that is larger in magnitude than one or more (or all) other light emitting devices 102 in the same bin 406. In the illustrated example of FIG. 4, the characteristic data 400A of a light emitting device 102 in the bin 406A is selected for pairing with another light emitting device 102 because the characteristic data 400A is farther from the target value than all other characteristics 400 in the same bin 406A. Alternatively, a light emitting device 102 having another characteristic data 400 may be selected for pairing.

At 310, a determination is made as to whether or not there is another light emitting device in an opposing or opposite bin having a difference that is similar in magnitude but opposite in direction as the difference of the light emitting device being examined for pairing. In the example of FIG. 4, the characteristic data 400 in the bin 406B that opposes or is opposite of the bin 406A is examined to determine if any of the characteristic data 400 has a difference vector with the same or similar magnitude but an opposite direction. The characteristic data 400 that is examined is in the bin 408B that is 180° away from the bin 406A that includes the characteristic data 400A of the light emitting device 102 being paired with another light emitting device 102. The differences or difference vectors of the characteristic data in different bins 406 may be similar in magnitude when the differences are within a designated threshold range of each other, such as within 0.5%, 1%, 2%, 5%, or the like. In the illustrated example, the characteristic data 400B in the bin 406B is identified as having a difference vector or difference 410 from the target value that is equal or similar in magnitude to the difference vector or difference 408 of the characteristic data 400A, but that is opposite in direction to the difference or difference vector 408, as shown in FIG. 4. As a result, the characteristic data 400B may be identified as being associated with a light emitting device 102 that may be paired with the light emitting device 102 associated with the characteristic data 400A, and flow of the method 300 may proceed from 310 to 312.

At 312, the light emitting devices 102 are paired together. For example, the first light emitting device 102 having the characteristic data 400A is paired with the second light emitting device 102 having the characteristic data 400B. These light emitting devices 102 may be grouped or paired in that these light emitting device 102 are associated with each other, without necessarily mechanically coupling or connecting the light emitting devices 102 together. Flow of the method 300 may then proceed toward 316.

Returning to the description of 310, if a second light emitting device 102 associated with the characteristic data 400B having a difference to the target value that is the same or similar in magnitude as the difference 408 but opposite in direction is not identified at 310, then flow of the method 300 can proceed toward 314. For example, if no characteristic data 400 in the bin 406B has a difference or difference vector to the target value that is the same or similar as the characteristic data 400A and that is opposite in direction as the difference or difference vector 408A, then the light emitting device 102 having the characteristic data 400A may not be paired or otherwise grouped with another light emitting device 102 at this stage of the method 300. As a result, flow of the method 300 can proceed toward 314.

At 314, the first light emitting device is identified or labeled as an unpaired light emitting device 102. For example, if the characteristic data 400A of the light emitting device 102 has the difference or difference vector 408, but there is no other light emitting device 102 having characteristic data 400 in the bin 406B with a difference or difference vector that is equal or similar in magnitude but opposite in direction, then the light emitting device 102 associated with the characteristic data 400A is not paired with another light emitting device 102 in the bin 406B. Flow the method may proceed toward 316

At 316, a determination is made as to whether any remaining characteristic data in the bin currently being examined have not yet been examined for pairing. For example, with respect to the bin 406A, a determination is made as to whether or not all of the characteristic data 400 located within the bin 406A have been examined to determine if there is another characteristic data 400 in the opposite bin a difference to the target value that is equal or similar in magnitude but opposite in direction.

If all of the characteristic data 400 have been examined for pairing, then flow of the method 300 may proceed toward 320. But, if one or more additional light emitting devices 102 have characteristic data 400 in the bin under examination and have not yet been examined to determine whether to pair the light emitting device 102 with another light emitting device, then flow of the method 400 can proceed toward 318.

At 318, a different characteristic data in the bin currently under examination is selected for pairing. In one embodiment, the method 300 may select the characteristic data 400 in the same bin that is next farthest from the target value. For example, the method 300 may attempt to pair the light emitting devices in an order based on how far the characteristic data are from the target value, with the larger differences between the characteristic data and the target value being examined for pairing before the characteristic data having smaller differences to the target value. Alternatively, the next characteristic data to be examined for pairing may be selected in another manner or another order.

Flow of the method 300 can return toward 310 to examine the characteristic data of another light emitting device and determine if this light emitting device can be paired with another light emitting device, as described above. The method 300 may proceed in a loop-wise manner to determine whether to group or pair the light emitting devices in a selected bin with light emitting devices in the opposite bin until the characteristic data of all (or at least a threshold amount) of the light emitting devices in the selected bin are examined. Alternatively, the method 300 may examine the characteristic data of the light emitting devices in another order, such as by examining the characteristic data of the light emitting devices having characteristic data across several different bins before completing examination of all (or at least a threshold amount of) characteristic data of the light emitting diodes in the same bin.

At 320, a determination is made as to whether or not all (or least a threshold amount) of the characteristic data in all (or at least half) of the bins have been examined. If all of the characteristic data have been examined in all of the bins (or at least half of the bins), then flow the method may proceed toward 324. On the other hand, if one or more bins have characteristic data has not been examined, then flow the method may proceed toward 322.

At 322, the method 300 switches which of the bins is being used to attempt to pair the characteristic data. For example, once the characteristic data 400 in the bin 406A have been examined to determine whether or not to pair the light emitting diodes 102 associated with the characteristic data 400 with another light emitting device 102 (or to label the light emitting devices 102 as an unpaired light emitting device), the method 300 may begin examining the characteristic data 400 in another bin 406. Flow the method 300 may then return toward 308. As described above in connection with 308, a first light emitting device in the new bin under examination may be selected. The method 300 may proceed in a loop-wise manner to examine the characteristic data in the new bin under examination until all the characteristic data (or at least a threshold amount of the characteristic data) in that bin have been examined to determine whether or not to pair the light emitting devices 102 or identify the light emitting devices 102 as unpaired light emitting devices.

At 324, once the light emitting devices in the bins have been examined, a determination is made as to whether or not the number of bins in the color space can be reduced. For example, if several unpaired light emitting devices remain, and the number of virtual bins in the color space used in the previous pairing process can be reduced (for example, by keeping the number of virtual bins an even number that is greater than or equal to 2), then the number of virtual bins may be reduced to attempt to pair the unpaired light emitting devices. As a result, flow the method 300 can proceed toward 326.

At 326, the number of virtual bins used to divide the color space and pair the light emitting devices with each other based on the characteristic data is reduced. For example, the characteristic data 400 shown in FIG. 4 of the light emitting devices 102 that been paired with other light emitting devices may be removed from the color space. The characteristic data of the unpaired light emitting devices may remain in the color space. The color space that includes the characteristic data of the unpaired light emitting devices may then be divided into virtual bins, as described above in connection with 304. One difference, however, is that the number of bins in which the color space is divided for the characteristic data 400 of the unpaired light emitting devices may be reduced. For example, instead of using twelve virtual bins 406 to divide of the color space, ten virtual bins (or another number of virtual bins) may be used to divide up the color space.

Figure 5:
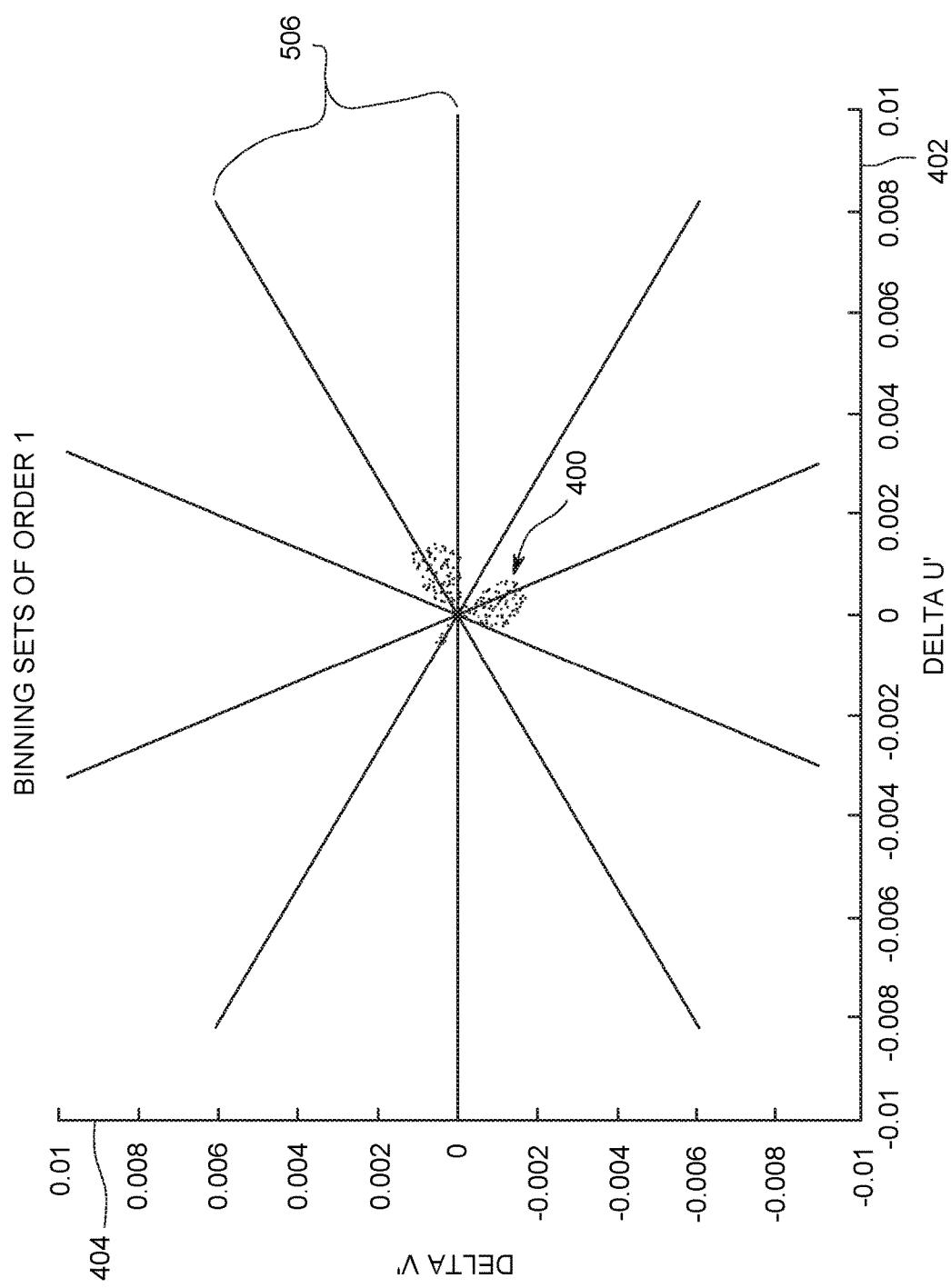
FIG. 5 illustrates the characteristic data of the unpaired light emitting devices shown in FIG. 1 according to one example.

With continued reference to the method 300 shown in FIG. 3, FIG. 5 illustrates the characteristic data 400 of the unpaired light emitting devices 102 shown in FIG. 1 according to one example. The characteristic data 400 of the unpaired light emitting devices 102 are shown in FIG. 5 alongside the horizontal and vertical axes 402, 404 described above. The color space shown in FIG. 5 is divided into virtual bins 506, with ten virtual bins 506 being used in the example of FIG. 5. Alternatively, the color space shown in FIG. 5 may be divided into another number of virtual bins 506, such as eight, six, four, or two virtual bins 506.

Once the number of virtual bins has been reduced, flow of the method 300 may return back toward 308. For example, a first light emitting diode having characteristic data 400 in a selected bin of the reduced number of bins (for example, the $i^{th}$ bin) may be selected for determining whether or not that light emitting device can be paired with another light emitting device in the opposite bin. Flow the method may then repeat in one or more loops to examine the characteristic data 400 of the light emitting devices 102 in the bins 506 to determine whether or not the different light emitting devices 102 may be paired with other light emitting devices 102 and/or whether some of the light emitting devices 102 are unpaired light emitting devices 102. After examining the characteristic data 400 in the reduced number of bins, flow of the method 300 may return toward 324 to determine whether or not the number of bins can be reduced. In the illustrated example of FIG. 5, the number of bins 506 can be reduced, for example, to eight bins. As a result, flow the method 300 may proceed to 326 with the number of bins being reduced (e.g., to eight bins). The method 300 may then return back toward 308 and proceed in a loop-wise manner to examine the characteristic data 400 of the light emitting devices 102 to determine which devices 102 in the reduced number of bins 506 may be paired with other light emitting devices 102, and which light emitting devices 102 are unpaired devices 102.

Figure 6:
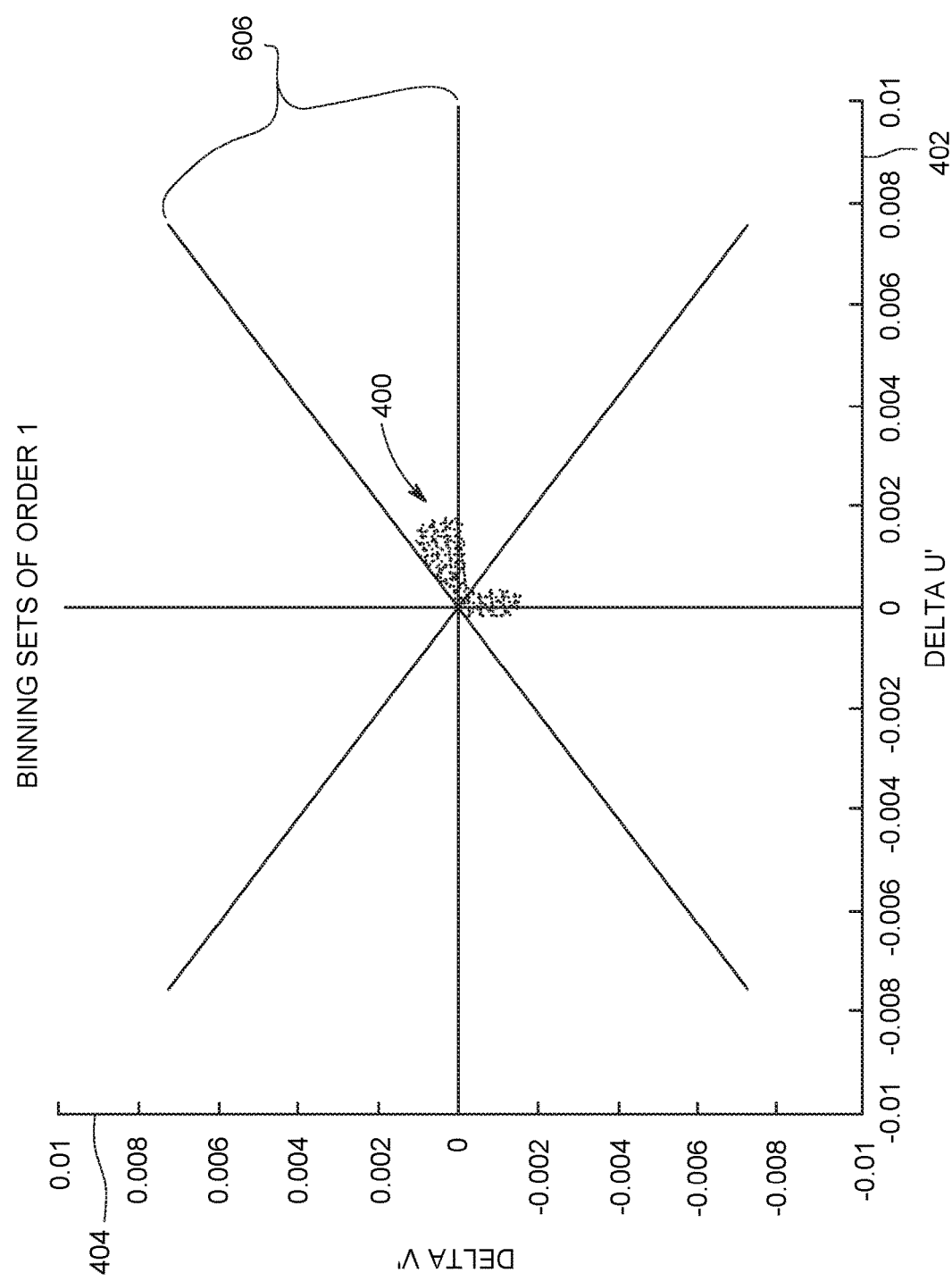
FIG. 6 illustrates another example of the color space with the number of virtual bins reduced relative to the color space shown in FIG. 5 according to one example.
Figure 7:
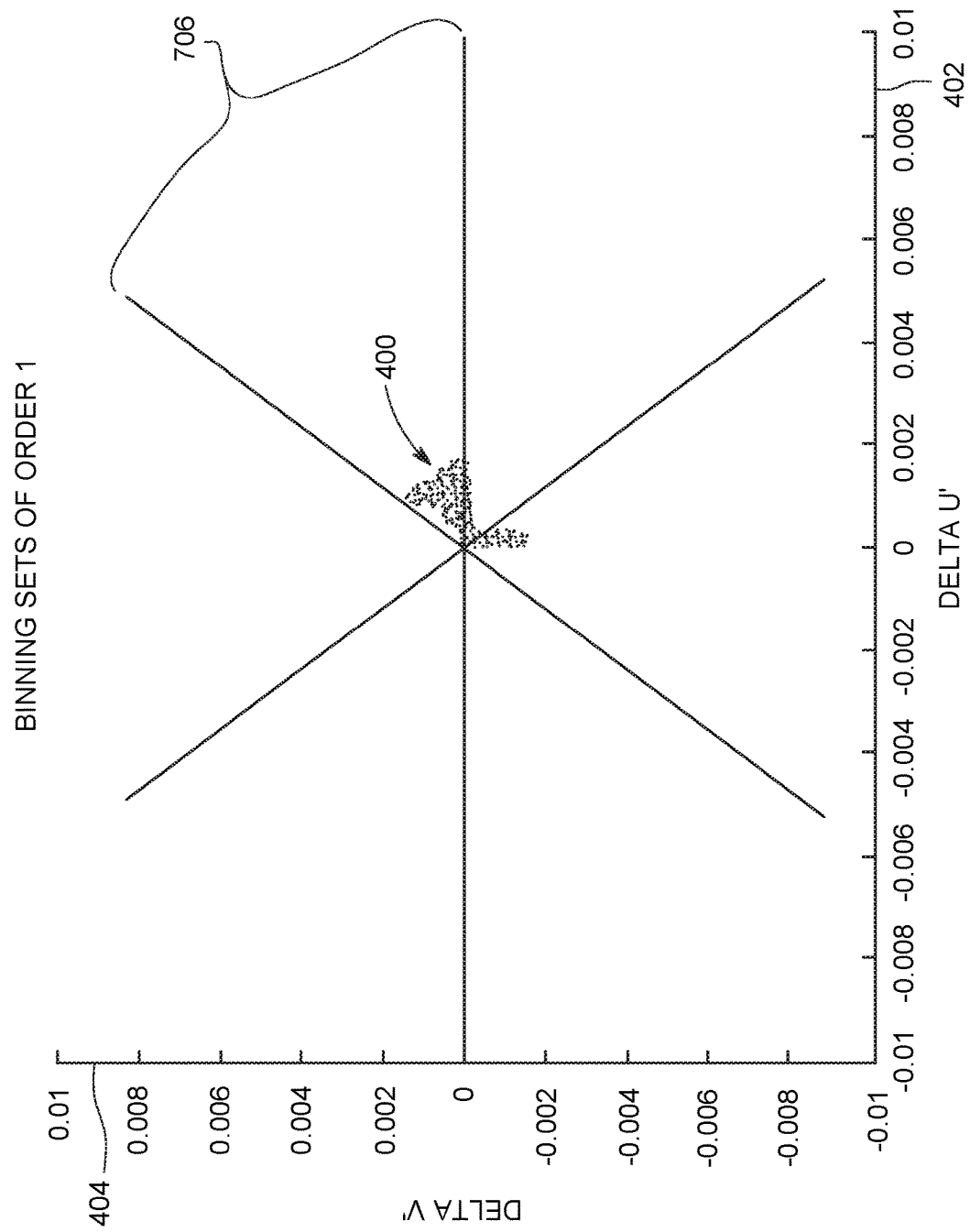
FIG. 7 illustrates additional examples of the color space with the number of virtual bins being reduced additional times according to one example.
Figure 8:
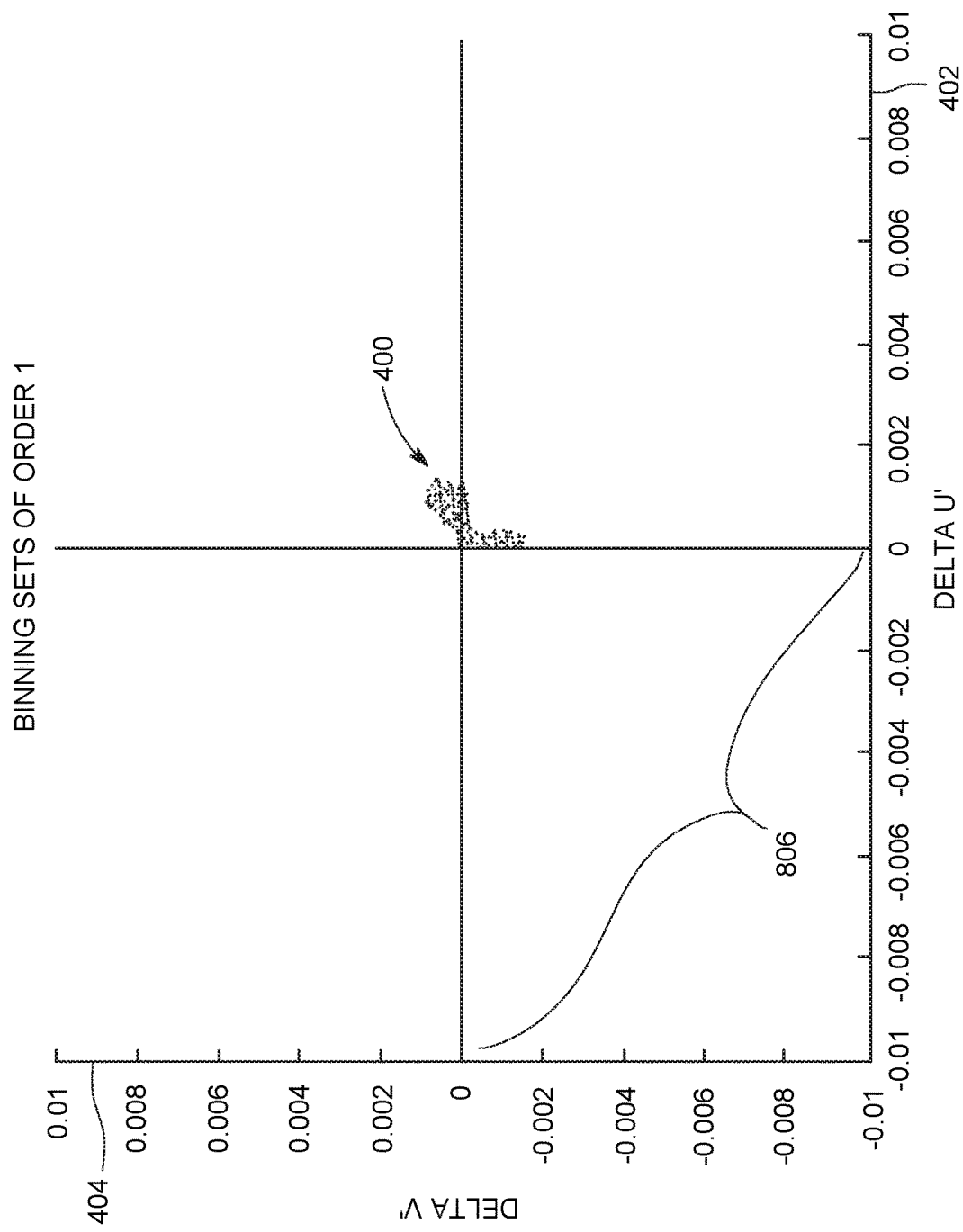
FIG. 8 illustrates additional examples of the color space with the number of virtual bins being reduced additional times according to one example.
Figure 9:
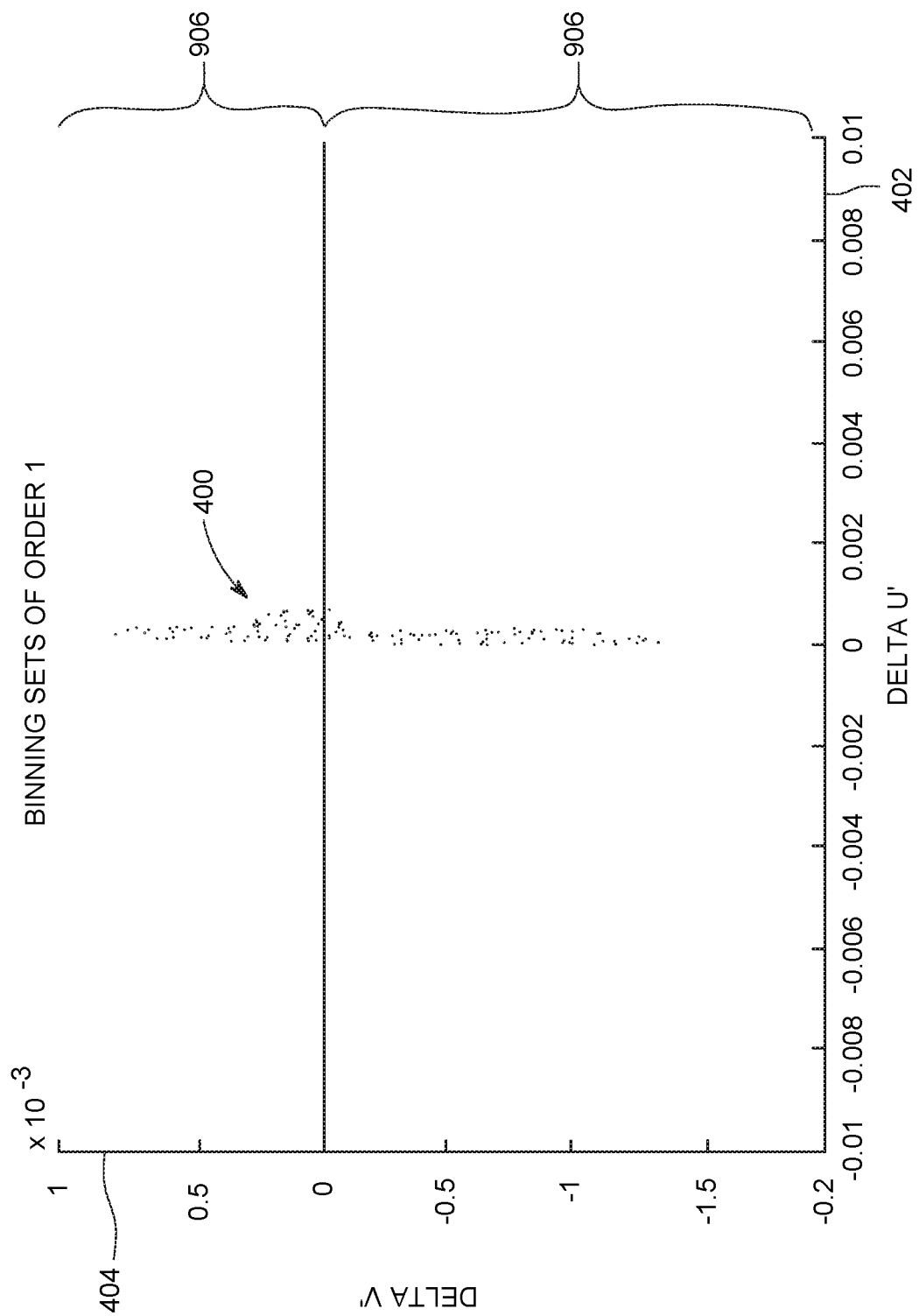
FIG. 9 illustrates the characteristic data of the unpaired light emitting devices from the color space having four virtual bins (e.g., FIG. 8), with the characteristic data divided among two virtual bins.

FIG. 6 illustrates another example of the color space with the number of virtual bins reduced relative to the color space shown in FIG. 5 according to one example. FIGS. 7 and 8 illustrate additional examples of the color space with the number of virtual bins being reduced additional times according to one example. The number of bins may be reduced after examining the characteristic data, determining which light emitting devices can be paired with other light emitting devices, and determining which light emitting devices are unpaired devices. The number of bins may be reduced for the unpaired light emitting devices from the previous examination of the characteristic data, and the process may repeat with a reduced number of bins. FIG. 6 illustrates the characteristic data 400 of the unpaired light emitting devices from the color space having ten virtual bins (e.g., FIG. 5), with the characteristic data divided among eight virtual bins 606. FIG. 7 illustrates the characteristic data 400 of the unpaired light emitting devices from the color space having eight virtual bins (e.g., FIG. 6), with the characteristic data divided among six virtual bins 706. FIG. 8 illustrates the characteristic data of the unpaired light emitting devices from the color space having six virtual bins (e.g., FIG. 7), with the characteristic data divided among four virtual bins 806. FIG. 9 illustrates the characteristic data 400 of the unpaired light emitting devices from the color space having four virtual bins (e.g., FIG. 8), with the characteristic data divided among two virtual bins 906. While the number of virtual bins 906 in FIG. 9 divide the color space along the horizontal axis or parallel to the horizontal axis 402, alternatively, the virtual bins 906 may divide the color space in a direction that is parallel to or coextensive with the vertical axis 404, or in another direction (e.g., transverse to both the horizontal and vertical axes 402, 404).

Returning to the description of the method 300 shown in FIG. 3, if the number of virtual bins cannot be reduced further (for example, the number of virtual bins is two), then flow the method 300 may proceed from 324 toward 328. At 328, the remaining light emitting devices are paired with each other based on the differences between the characteristic data of the remaining light emitting diodes and the target value. For example, the characteristic data 400 in the color space bifurcated by the virtual bins 906 shown in FIG. 9 may then be paired with each other based on the magnitude of the distances of the characteristic data to the target value. In one embodiment, the light emitting diode with the characteristic data that is farthest from the target value in one of the virtual bins 906 is paired with the light emitting device having a characteristic data 400 in the other virtual bin 906 that also is farthest from the target value in that virtual bin 906, regardless of whether the directions of the difference vectors of the characteristic data 400 to the target value oppose each other. The method 300 may then pair the light emitting device 102 having the next farthest characteristic data 400 from the target value in one virtual bin 906 with the light emitting device 102 having the next farthest characteristic data 400 from the target value in the other virtual bin 906, and so on, until all light emitting devices are paired or an odd number (for example, one) of the light emitting devices 102 remains unpaired.

At 330, group characteristic data is determined for each of the different groups or pairs of the light emitting devices 102. The group characteristic data represents the characteristic data of the combination of the light emitting devices in each pair of light emitting devices. For example, after pairing or otherwise grouping the light emitting devices 102 as described above in connection with the method 300, characteristic data for each of the pairs or groups of light emitting devices may be determined. In one example, the light that is generated by a combination of the light emitting devices in each of the pair of light emitting devices is examined or measured to determine the chromaticity, luminous flux, or other characteristic of the light. Optionally, a combined forward voltage of the light emitting devices in a pair may be determined as the characteristic data for the light emitting devices in the pair for each of the pairs of the lightning devices previously determined in the method 300.

At 332, the characteristic data for the different pairs or groups of the light emitting devices may then be examined to determine which pairs of the light emitting devices may be combined into larger groups (or pairs of pairs) of lightning devices, and to determine which pairs of the light emitting devices are unpaired light emitting devices.

Figure 10:
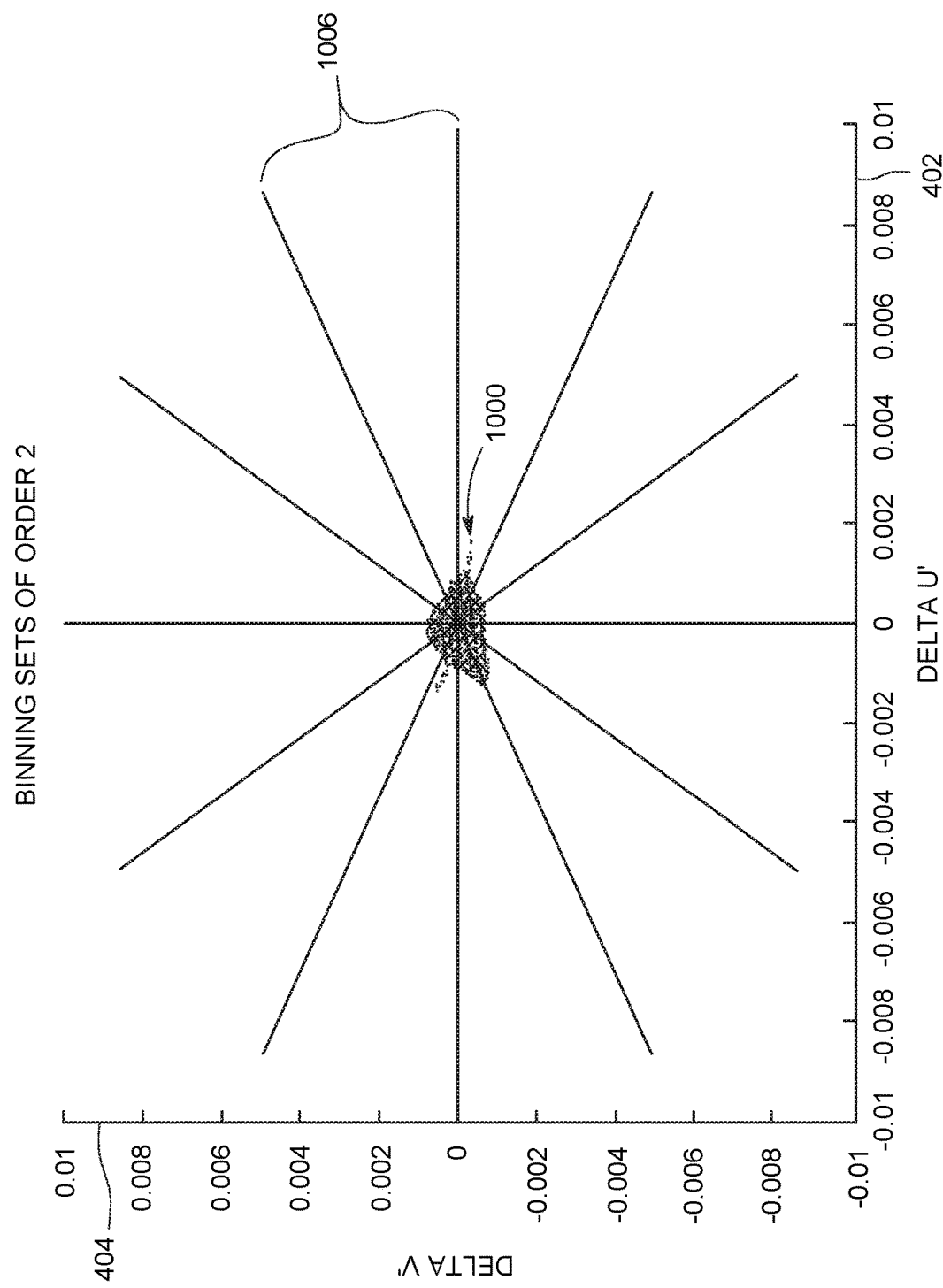
FIG. 10 illustrates group characteristic data of the pairs of the light emitting devices according to one example.

FIG. 10 illustrates group characteristic data 1000 of the pairs of the light emitting devices 102 according to one example. The characteristic data 1000 represents the combined characteristic data of the light emitting devices 102 in each pair or group as previously determined by the method 300. As shown in FIG. 10, because the light emitting devices have already been paired together, the combined output of the pairs of light emitting devices 102 has characteristic data 1000 that is closer to the target value than the characteristic data 400 of the individual light emitting devices 102 (as shown by comparison of FIGS. 4 and 10).

The characteristic data 1000 of the pairs of the light emitting devices 102 may then be used in a manner similar to as described above to pair the pairs of light emitting devices 102. For example, the color space shown in FIG. 10 may be divided into an even number of virtual bins 1006. Although twelve bins 1006 are shown in FIG. 10, another number may be used. Similar to as described above with the individual light emitting devices 102, the characteristic data 1000 for a pair of light emitting devices 102 in a selected bin 1006 may be examined to determine a difference (for example, the magnitude and direction) of the characteristic data 1000 to the target value. If another pair of light emitting devices 102 has characteristic data 1000 in an opposing bin 1006 with the same or similar magnitude, but opposite direction, then the two pairs of the light emitting devices 102 may be combined into a larger group of light emitting devices 102.

The method 300 may proceed in a loop-wise manner to examine the characteristic data 1000 of the pairs of the light emitting devices 102 to determine which pairs of the light emitting devices 102 can be grouped with other pairs of the light emitting devices 102 and which pairs of the light emitting devices 102 are not paired with other pairs of the light emitting devices 102. The color space may be divided into a smaller number of virtual bins and the pairing process may repeat, as described above. The method 300 may repeat by attempting to pair the pairs of light emitting devices based on the differences to the target value, and reducing the number of bins in the color space until all pairs of light emitting devices are grouped with another pair of lightning devices, or an odd number (for example, one) of the pairs of light emitting devices 102 remain. The method 300 may then terminate with the identified groups of paired pairs of light emitting devices. Alternatively, the method 300 may repeat one or more additional times to further group the four light emitting devices 102 in each pair of paired light emitting devices 102 with other groups of four light emitting devices 102. The method 300 may repeat to increase the number of light emitting devices that are within each group of light emitting devices.

The groups of the light emitting devices 102 may then be used to determine which light emitting devices 102 are included in different light devices 100. Because the light emitting devices 102 have been paired to each other based on the differences of the characteristic data to target values, the characteristic data of the combined light emitting devices 102 in the group is closer the target value than if the light emitting devices were randomly selected or if a different combination of the light emitting devices 102 were used in the same light device 102.

Figure 11:
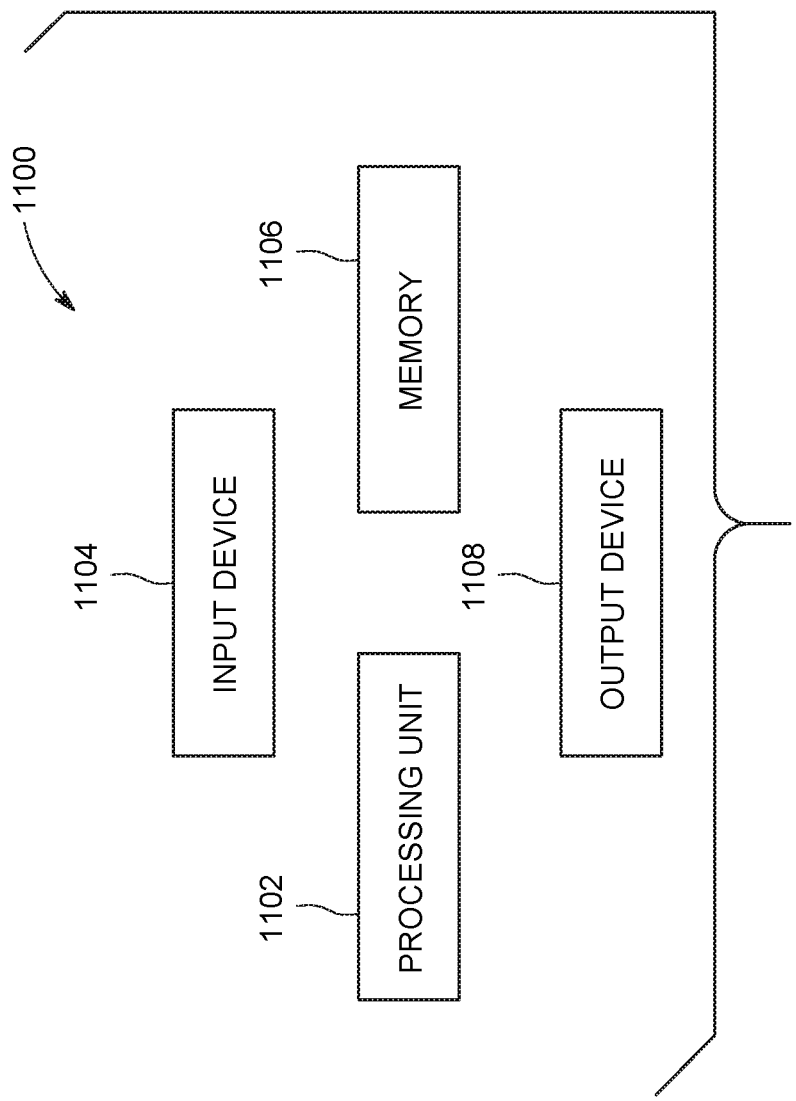
FIG. 11 illustrates a schematic diagram of a lighting selection system according to one embodiment.

FIG. 11 illustrates a schematic diagram of a lighting selection system 1100 according to one embodiment. The system 1100 may be used to perform one or more embodiments of the methods 200, 300 described above. For example, the operations described in connection with the methods 200, 300 may be used to create a software programmer algorithm that controls operations of or more computing devices, such a specially programmed computing device. Alternatively, the operations described in connection with the method 200, 300 may represent the software program that controls operations of the computing devices in the system 1100.

The system 1100 includes a processing unit 1102 that receives input from an input device 1104. The processing unit 1102 can represent hardware circuitry that includes and/or is connected with one or more processors, such as one or more microprocessors, integrated circuits, field programmable gate arrays, or the like. The processing unit may perform the operations described in connection with the methods 200, 300. The input device 1104 represents one or more hardware devices that receive input for use by the processing unit 1102 in determining the groups of light emitting devices 102 to be included in the different light devices 100. The input device 1104 can represent a disk drive, a USB connection, a cable connection, a wireless transceiver, a keyboard, a stylus, a touchscreen, or the like. The input device can receive the measurements of the light emitting devices as a characteristic data 400, 1000 described above. In one aspect, the input device 104 can represent a sensor that measures the characteristic data, such as a light sensor, a voltmeter, or the like.

A memory 1106 can include one or more computer readable medium media, such as a computer hard drive, a random access memory, a read-only memory, or the like. The memory 1106 can be used to store the characteristic data 400, 1000, the pairings of the light emitting devices 102, the color space used to pair of light emitting devices, the number of virtual bins, or the like. The processing unit 1102 can generate one or more signals communicated to the memory 1106 to instruct the memory 1106 to store which light emitting devices 102 are to be paired or grouped with each other.

An output device 1108 represents one or more hardware devices that generate output of the system 1100. The upper device 1108 can represent a monitor, or other display, a speaker, a printer, transceiving circuitry, or the like. The processing unit 1102 may generate control signals that are communicated to the output device 1108 to control the output device 1108 and cause the output device to generate output that represents the pairings of the light emitting devices. For example, the processing unit 1108 can instruct the output device 1108 to generate a display that shows a user of the system 1100 the color space and characteristic data 400, 1100, the virtual bins, or the like, as well as identify which light devices 102 are to be combined with each other for use in the same light device 100. In one embodiment, the processing unit 1102 generates a control signal to the output device 1108, which communicates with one or more systems outside of the system 1100. For example, the output device 1108 can transmit or broadcast the control signal to a system that automatically sorts light emitting devices for inclusion in different light devices 100. The control signal generated by the output device 1108 construct such an automated system to group the light emitting devices 102 into pairs, pairs of pairs, or other groups that are to be included in different light devices 100.

As described above, one or more embodiments of the lighting selection systems and methods described herein obtain individualized characteristic data for different light emitting devices. Using differences between the characteristic data of the individual light emitting devices a designated target value of the characteristic data, the systems and methods pair or otherwise combine the different lightning devices into pairs, pairs of pairs, or larger groups. The characteristic data of the combined light emitting devices in a group is closer to the designated target value than other pairs or combinations of the light emitting devices. Because the magnitude and direction of the differences (for example the difference vectors) from the characteristic data of the individual or paired light emitting devices to target value are combined with differences having equal or similar but opposing difference vectors to the same target value, the combined output of the pairs, or larger groups of light emitting devices yields a light that is closer does a target value than other groups or combinations of the same light emitting devices.

In one embodiment, a method (e.g., a method for selecting light emitting devices for inclusion in a light device) includes obtaining individualized characteristic data for each of plural light emitting devices, determining a difference between a value of the characteristic data and a designated target value for each of the light emitting devices, and grouping the light emitting devices into different groups based on the differences between the values of the characteristic data and the designated target value. The differences of the light emitting devices in a common group of the groups are closer together than the differences of the light emitting devices in other groups of the groups. The method also includes selecting at least one of the groups of the light emitting devices for inclusion in a light device.

In one aspect, the characteristic data represents one or more of a forward voltage, a luminous flux of light emitted by the light emitting device, or a color of the light emitted by the light emitting device.

In one aspect, grouping the light emitting devices into the different groups includes identifying pairs of the light emitting diodes having the differences with opposite values and including the light emitting diodes in each of the pairs in the same group.

In one aspect, grouping the light emitting devices into different groups includes, for each of the groups, identifying a first light emitting device having a first value of the difference between the value of the characteristic data and the designated target value, identifying a different, second light emitting device having a second value of the difference that is opposite of the first value, and grouping the first light emitting device with the second light emitting device.

In one aspect, the value of the characteristic data includes chromaticity coordinates of light generated by the light emitting device. Determining the difference for each of the light emitting devices can include determining a distance from the chromaticity coordinate for the light generated by the light emitting device to a designated target chromaticity coordinate.

In one aspect, grouping the light emitting devices into different groups includes, for each of the groups, identifying a first light emitting device having a first set of chromaticity coordinates (where a first vector extends between the designated target chromaticity coordinate and the chromaticity coordinates in the first set), identifying a different, second light emitting device having a second set of the chromaticity coordinates (where a second vector extends between the designated target chromaticity coordinate and the chromaticity coordinates in the second set), and grouping the first light emitting device with the second light emitting device responsive to the first vector and the second vector having opposite directions.

In one aspect, the light emitting devices are grouped into the different groups such that a color point of a combined light generated by the light emitting devices in each group is closer to a designated color point for the groups than a different grouping of the light emitting devices.

In one aspect, the method also includes obtaining group characteristic data for each of the groups of the light emitting devices, determining a difference between a value of the group characteristic data and the designated target value for each of the groups of the light emitting devices, and grouping the groups of the light emitting devices into larger groups of the light emitting devices based on the differences between the values of the group characteristic data and the designated target value (where selecting the at least one of the groups of the light emitting devices for inclusion in the light device includes selecting at least one of the larger groups of the light emitting devices for inclusion in the light device).

In one aspect, the light emitting devices are light emitting diodes.

In another embodiment, a system (e.g., a light selection system) includes one or more processors configured to obtain individualized characteristic data for each of plural light emitting devices and to determine a difference between a value of the characteristic data and a designated target value for each of the light emitting devices. The one or more processors also are configured to determine different groups of the light emitting devices based on the differences between the values of the characteristic data and the designated target value. The differences of the light emitting devices in a common group of the groups are closer together than the differences of the light emitting devices in other groups of the groups.

In one aspect, the one or more processors are configured to generate an output signal representative of a selection of at least one of the groups of the light emitting devices for inclusion in a light device.

In one aspect, the characteristic data represents one or more of a forward voltage, a luminous flux of light emitted by the light emitting device, or a color of the light emitted by the light emitting device.

In one aspect, the one or more processors are configured to determine the groups of the light emitting devices by identifying pairs of the light emitting diodes having the differences with opposite values and including the light emitting diodes in each of the pairs in the same group.

In one aspect, the one or more processors are configured to determine the groups of the light emitting devices by identifying a first light emitting device having a first value of the difference between the value of the characteristic data and the designated target value for each of the groups, identifying a different, second light emitting device having a second value of the difference that is opposite of the first value for each of the groups, and associating the first light emitting device with the second light emitting device in the same group.

In one aspect, the value of the characteristic data includes chromaticity coordinates of light generated by the light emitting device. The one or more processors can be configured to determine the difference for each of the light emitting devices by determining a distance from the chromaticity coordinate for the light generated by the light emitting device to a designated target chromaticity coordinate.

In one aspect, the one or more processors are configured to determine the different groups by identifying a first light emitting device having a first set of chromaticity coordinates for each of the groups (where a first vector extends between the designated target chromaticity coordinate and the chromaticity coordinates in the first set), identifying a different, second light emitting device having a second set of the chromaticity coordinates for each of the groups (where a second vector extends between the designated target chromaticity coordinate and the chromaticity coordinates in the second set), and grouping the first light emitting device with the second light emitting device responsive to the first vector and the second vector having opposite directions for each of the groups.

In one aspect, the one or more processors are configured to associate the light emitting devices into the different groups such that a color point of a combined light generated by the light emitting devices in each group is closer to a designated color point for the groups than a different grouping of the light emitting devices.

In one aspect, the one or more processors are configured to obtain group characteristic data for each of the groups of the light emitting devices, determine a difference between a value of the group characteristic data and the designated target value for each of the groups of the light emitting devices, and associate the groups of the light emitting devices into larger groups of the light emitting devices based on the differences between the values of the group characteristic data and the designated target value.

In one aspect, the light emitting devices are light emitting diodes.

In another embodiment, a method (e.g., a method for selecting light emitting devices) includes determining chromaticity coordinates of light generated by each of plural light emitting diodes, determining differences between the chromaticity coordinates and a designated chromaticity coordinate of a designated target color for each of the light emitting diodes, grouping the light emitting diodes into pairs based on the differences (where each pair includes the light emitting diodes having vectors extending from the chromaticity coordinates to the designated chromaticity coordinate that are closer in magnitude to each other than other light emitting diodes but opposite in direction), and selecting at least one of the pairs of the light emitting devices for inclusion in a light device.

In one aspect, the method also includes dividing the light emitting diodes into different radial groups in color space based on the chromaticity coordinates, where grouping the light emitting diodes includes, for each of the radial groups, pairing a first light emitting diode in the radial group with a different, second light emitting diode in an opposite radial group with the differences between the chromaticity coordinates and the designated chromaticity coordinate of the first and second light emitting diodes are closer than other light emitting diodes in the radial group and the opposite radial group.

In one aspect, the method includes dividing the pairs of the light emitting diodes into paired radial groups in the color space based on chromaticity coordinates of combined light generated by the light emitting diodes in each of the pairs and combining the pairs of the light emitting diodes into larger groups of the pairs of the light emitting diodes by, for each of the paired radial groups, pairing a first pair of the light emitting diodes in the paired radial group with a different, second pair of the light emitting diodes in an opposite paired radial group with differences between chromaticity coordinates of the combined light generated by the light emitting diodes in each of the first and second pairs and the designated chromaticity coordinate are closer than other pairs of light emitting diodes in the paired radial group and the opposite paired radial group.

The foregoing description of certain embodiments of the inventive subject matter will be better understood when read in conjunction with the appended drawings. The various embodiments are not limited to the arrangements and instrumentality shown in the drawings. The above description is illustrative and not restrictive. For example, the above-described embodiments (and/or aspects thereof) may be used in combination with each other. In addition, many modifications may be made to adapt a particular situation or material to the teachings of the inventive subject matter without departing from its scope. While the dimensions and types of materials described herein are intended to define the parameters of the inventive subject matter, they are by no means limiting and are exemplary embodiments. Other embodiments may be apparent to one of ordinary skill in the art upon reviewing the above description. The scope of the inventive subject matter should, therefore, be determined with reference to the appended claims, along with the full scope of equivalents to which such claims are entitled.

In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure. And, as used herein, an element or step recited in the singular and proceeded with the word "a" or "an" should be understood as not excluding plural of said elements or steps, unless such exclusion is explicitly stated. Furthermore, references to "one embodiment" of the inventive subject matter are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

This written description uses examples to disclose several embodiments of the inventive subject matter and also to enable a person of ordinary skill in the art to practice the embodiments of the inventive subject matter, including making and using any devices or systems and performing any incorporated methods. The patentable scope of the inventive subject matter is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

What is claimed is:

1. A method for forming a light device, the method comprising:
   measuring individualized characteristic data for each of plural light emitting devices with one or more sensors;
   receiving the individualized characteristic data for each of plural light emitting devices from the one or more sensors;
   determining a difference between a value of the characteristic data and a designated target value for each of the light emitting devices by one or more microprocessors;
   grouping the light emitting devices into different groups based on the determined differences between the values of the characteristic data and the designated target value by the one or more microprocessors, the differences of the light emitting devices in a common group of the different groups being closer to the designated target value than the differences of the light emitting devices in other groups of the different groups to the designated target value;
   generating a control signal by the one or more microprocessors to an automated system to select at least one of the different groups of the light emitting devices for inclusion in a light device; and
   including, based on the determined grouping of the light emitting devices into the different groups, the light emitting devices from the selected group in the light device.

2. The method of claim 1, wherein the characteristic data represents one or more of a forward voltage, a luminous flux of light emitted by the light emitting device, or a color of the light emitted by the light emitting device.

3. The method of claim 1, wherein grouping the light emitting devices into the different groups includes identifying pairs of the light emitting diodes having the differences with opposite values and including the light emitting diodes in each of the pairs in the same group.

4. The method of claim 3, wherein grouping the light emitting devices into different groups includes, for each of the groups:
   identifying a first light emitting device having a first value of the difference between the value of the characteristic data and the designated target value;
   identifying a different, second light emitting device having a second value of the difference that is opposite of the first value; and
   grouping the first light emitting device with the second light emitting device.

5. The method of claim 1, wherein the value of the characteristic data includes chromaticity coordinates of light generated by the light emitting device, and the determining of the difference for each of the light emitting devices includes determining a distance from the chromaticity coordinate for the light generated by the light emitting device to a designated target chromaticity coordinate.

6. The method of claim 5, wherein grouping the light emitting devices into different groups includes, for each of the groups:
identifying a first light emitting device having a first set of chromaticity coordinates, wherein a first vector extends between the designated target chromaticity coordinate and the chromaticity coordinates in the first set;
identifying a different, second light emitting device having a second set of the chromaticity coordinates, wherein a second vector extends between the designated target chromaticity coordinate and the chromaticity coordinates in the second set; and
grouping the first light emitting device with the second light emitting device responsive to the first vector and the second vector having opposite directions.

7. The method of claim 1, wherein the light emitting devices are grouped into the different groups such that a color point of a combined light generated by the light emitting devices in each group is closer to a designated color point than a different grouping of the light emitting devices.

8. The method of claim 1, further comprising:
obtaining group characteristic data for each of the different groups of the light emitting devices;
determining a difference between a value of the group characteristic data and the designated target value for each of the different groups of the light emitting devices;
grouping the different groups of the light emitting devices into larger groups of the light emitting devices based on the differences between the values of the group characteristic data and the designated target value, wherein selecting the at least one of the different groups of the light emitting devices for inclusion in the light device includes selecting at least one of the larger groups of the light emitting devices for inclusion in the light device.

9. The method of claim 1, wherein the light emitting devices are light emitting diodes.

10. A system for forming a light device, the system comprising:
one or more sensors to measure individualized characteristic data for each of plural light emitting devices; and
one or more microprocessors to receive the individualized characteristic data from the one or more sensors and to:
determine a difference between a value of the characteristic data and a designated target value for each of the light emitting devices;
determine different groups of the light emitting devices based on the determined differences between the values of the characteristic data and the designated target value, the differences of the light emitting devices in a common group of the different groups being closer to the designated target value than the differences of the light emitting devices in other groups of the different groups to the designated target value;
generate a control signal to an automated system to select at least one of the different groups of the light emitting devices for inclusion in a light device and include, based on the determined different groups of the light emitting devices, the light emitting devices from the at least one selected group of the light emitting devices.

11. The system of claim 10, wherein the characteristic data represents one or more of a forward voltage, a luminous flux of light emitted by the light emitting device, or a color of the light emitted by the light emitting device.

12. The system of claim 10, wherein the one or more microprocessors are configured to determine the groups of the light emitting devices by identifying pairs of the light emitting diodes having the differences with opposite values and including the light emitting diodes in each of the pairs in the same group.

13. The system of claim 12, wherein the one or more microprocessors are configured to determine the different groups of the light emitting devices by:
identifying a first light emitting device having a first value of the difference between the value of the characteristic data and the designated target value for each of the groups;
identifying a different, second light emitting device having a second value of the difference that is opposite of the first value for each of the groups; and
associating the first light emitting device with the second light emitting device in the same group.

14. The system of claim 10, wherein the value of the characteristic data includes chromaticity coordinates of light generated by the light emitting device, and the one or more processors are configured to determine the difference for each of the light emitting devices by determining a distance from the chromaticity coordinate for the light generated by the light emitting device to a designated target chromaticity coordinate.

15. The system of claim 14, wherein the one or more microprocessors are configured to determine the different groups by:
identifying a first light emitting device having a first set of chromaticity coordinates for each of the groups, wherein a first vector extends between the designated target chromaticity coordinate and the chromaticity coordinates in the first set;
identifying a different, second light emitting device having a second set of the chromaticity coordinates for each of the groups, wherein a second vector extends between the designated target chromaticity coordinate and the chromaticity coordinates in the second set; and
grouping the first light emitting device with the second light emitting device responsive to the first vector and the second vector having opposite directions for each of the groups.

16. The system of claim 10, wherein the one or more microprocessors are configured to associate the light emitting devices into the different groups such that a color point of a combined light generated by the light emitting devices in each group is closer to a designated color point for the groups than a different grouping of the light emitting devices.

17. The system of claim 10, wherein the one or more microprocessors are configured to:
obtain group characteristic data for each of the groups of the light emitting devices;
determine a difference between a value of the group characteristic data and the designated target value for each of the groups of the light emitting devices; and
associate the groups of the light emitting devices into larger groups of the light emitting devices based on the differences between the values of the group characteristic data and the designated target value.

18. The system of claim 10, wherein the light emitting devices are light emitting diodes.

19. A method for forming a light device, the method comprising:
measuring individualized characteristic data for each of plurality of light emitting diodes with one or more sensors, a value of the individualized characteristic data being chromaticity coordinates of light generated by each of the plurality of light emitting diodes;

receiving the individualized characteristic data for each of the plurality of light emitting diodes from the one or more sensors;

determining differences between the chromaticity coordinates of light generated by each of the plurality of light emitting diodes and a designated chromaticity coordinate of a designated target color for each of the light emitting diodes by one or more microprocessors;

grouping, by the one or more microprocessors, the light emitting diodes into pairs based on the determined differences, each pair including the light emitting diodes having vectors extending from the chromaticity coordinates to the designated chromaticity coordinate that are closer in magnitude to each other than other light emitting diodes of the plurality of light emitting diodes but opposite in direction;

generating a control signal by the one or more microprocessors to an automated system for selecting at least one of the pairs of the light emitting diodes for inclusion in a light device; and including, based on the determined grouping of the light emitting diodes into the pairs, the light emitting diodes from the selected group in the light device.

20. The method of claim 19, further comprising:
dividing the light emitting diodes into different radial groups in color space based on the chromaticity coordinates, wherein grouping the light emitting diodes includes, for each of the radial groups, pairing a first light emitting diode in the radial group with a different, second light emitting diode in an opposite radial group with the differences between the chromaticity coordinates and the designated chromaticity coordinate of the first and second light emitting diodes are closer than other light emitting diodes in the radial group and the opposite radial group.

21. The method of claim 20, further comprising:
dividing the pairs of the light emitting diodes into paired radial groups in the color space based on chromaticity coordinates of combined light generated by the light emitting diodes in each of the pairs; and combining the pairs of the light emitting diodes into larger groups of the pairs of the light emitting diodes by, for each of the paired radial groups, pairing a first pair of the light emitting diodes in the paired radial group with a different, second pair of the light emitting diodes in an opposite paired radial group with differences between chromaticity coordinates of the combined light generated by the light emitting diodes in each of the first and second pairs and the designated chromaticity coordinate are closer than other pairs of light emitting diodes in the paired radial group and the opposite paired radial group.

\* \* \* \* \*